United States Patent
Broer et al.

(10) Patent No.: US 6,320,633 B1
(45) Date of Patent: Nov. 20, 2001

(54) DISPLAY DEVICE AND METHOD OF MANUFACTURING SUCH A DISPLAY DEVICE

(75) Inventors: Dirk J. Broer; Christianne M. R. De Witz, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/531,942

(22) Filed: Mar. 21, 2000

(30) Foreign Application Priority Data

Mar. 23, 1999 (EP) .................................................. 99200898

(51) Int. Cl.[7] .................................................. G02F 1/1335
(52) U.S. Cl. .............................. 349/113; 349/112; 349/71
(58) Field of Search ..................................... 349/112, 113, 349/71, 138, 187

(56) References Cited

U.S. PATENT DOCUMENTS

| 3,998,526 | * | 12/1976 | Katz | 349/71 |
| 4,394,068 | * | 7/1983 | Page et al. | 349/71 |
| 4,822,144 | | 4/1989 | Vriens | 349/71 |
| 4,830,469 | * | 5/1989 | Breddels et al. | 349/71 |
| 4,882,617 | * | 11/1989 | Vriens | 349/71 |
| 5,146,355 | * | 9/1992 | Prince et al. | 349/71 |

* cited by examiner

Primary Examiner—Toan Ton
(74) Attorney, Agent, or Firm—Aaron Waxler

(57) ABSTRACT

Display device in which light is generated in patterned areas of electroluminescent material (via UV radiation, LED-driving or optical pumping), which light leaves the areas by waveguiding along edges of said area, where it is directed to the viewer by light-scattering or reflecting elements.

12 Claims, 5 Drawing Sheets

DISPLAY DEVICE AND METHOD OF MANUFACTURING SUCH A DISPLAY DEVICE

FIELD OF THE INVENTION

The invention relates to a display device comprising a first substrate with pixels, provided with a layer of luminescent material patterned in areas, and means for exciting the luminescent material during use. Such patterned layers may be activated by means of ultraviolet radiation which is modulated by a suitable switch, for example, an LCD switch. The separate areas may alternatively form pixels of a display device based on electroluminescence, such as a polymer (O)LED.

The invention also relates to a method of manufacturing such a display device.

BACKGROUND OF THE INVENTION

A display device of the type described above is known from U.S. Pat. No. 4,822,144. In one of the examples shown in this patent, a pattern of phosphors is excited by UV radiation via an LCD switch. Notably when the luminescent layers in said example are transparent (organic) phosphors, waveguiding may occur in these layers due to reflection on the interfaces with, for example, the substrate or a transparent protective coating in such a layer. The same applies to layers of electroluminescent material forming, for example, an (O)LED or (Organic)Light-Emitting Device. Due to said waveguiding, much of the light generated in the layers is lost. Another consequence is that the light leaves the layers at undesired areas in the viewing direction, so that, for example, colors are mixed. Moreover, the layer of luminescent material is often coated with a transparent protective coating. Daylight is reflected on each of the layers (the substrate, the layer of luminescent material and the transparent protective coating), which is at the expense of the contrast.

SUMMARY OF THE INVENTION

It is, inter alia, an object of the present invention to obviate one or more of said drawbacks. To this end, a display device according to the invention is characterized in that at least an area of the layer of luminescent material is situated between a light-absorbing layer present at the viewer's side of the display device and a dielectric layer, and, in plan view, is provided with light-reflecting or light-scattering means at least along a part of its edge. In this application, a dielectric layer is understood to mean a layer having a low refractive index as compared with the refractive index of the layer of luminescent material. This may be an underlying substrate but is preferably a stack of layers having mutually different refractive indices (a sub-layer may have a higher refractive index than the layer of luminescent material).

By providing light-reflecting or light-scattering means along the edge, it is achieved that light at the area of the edge (in the direction of the viewer) is reflected or scattered. This raises the light output. Moreover, it is avoided that light reaches an adjacent area of the layer of luminescent material via said waveguiding; this largely prevents said color mixing. The light-absorbing layer absorbs ambient light so that no troublesome reflections occur any longer and the contrast is enhanced.

A preferred embodiment of a display device according to the invention is characterized in that a layer reflecting light in the direction of the layer of luminescent material is situated between the light-absorbing layer and the layer of luminescent material. Said waveguiding is, as it were, intensified thereby and used to advantage.

The light-reflecting or light-scattering means may not only be provided along the edge of the separate areas of the patterned layer of luminescent material but may also be situated within apertures in these areas.

When using light-reflecting means, reflective surfaces at an angle of approximately 45° with respect to the substrate are preferably chosen. A further preferred embodiment of a display device according to the invention is characterized in that at least one head end of an area of the layer of luminescent material is provided with semi-transparent mirrors. In this case, an optically intensified effect (laser effect) occurs under well-chosen conditions. Advantages are a higher light output and the fact that saturated colors are obtained because of the narrow emission band (single line emission).

A first method of manufacturing such a display device is characterized in that a layer of luminescent material patterned in areas is provided on a substrate, whereafter a layer of light-reflecting material is deposited in a first direction at an angle of between 10 and 30 degrees with respect to the normal on the surface, reflecting or light-scattering material is provided between the separate areas, and the areas are coated with a light-absorbing material.

These and other aspects of the invention are apparent from and will be elucidated with reference to the embodiments described hereinafter.

BRIEF DESCRIPTION OF THE DRAWINGS

In the drawings:

FIG. 9 is a cross-section of this device during a stage of its manufacture, while

The Figures are diagrammatic and not drawn to scale. Corresponding parts are generally denoted by the same reference numerals.

DETAILED DESCRIPTION OF THE PREFERRED EMBODIMENT

Figure 1:
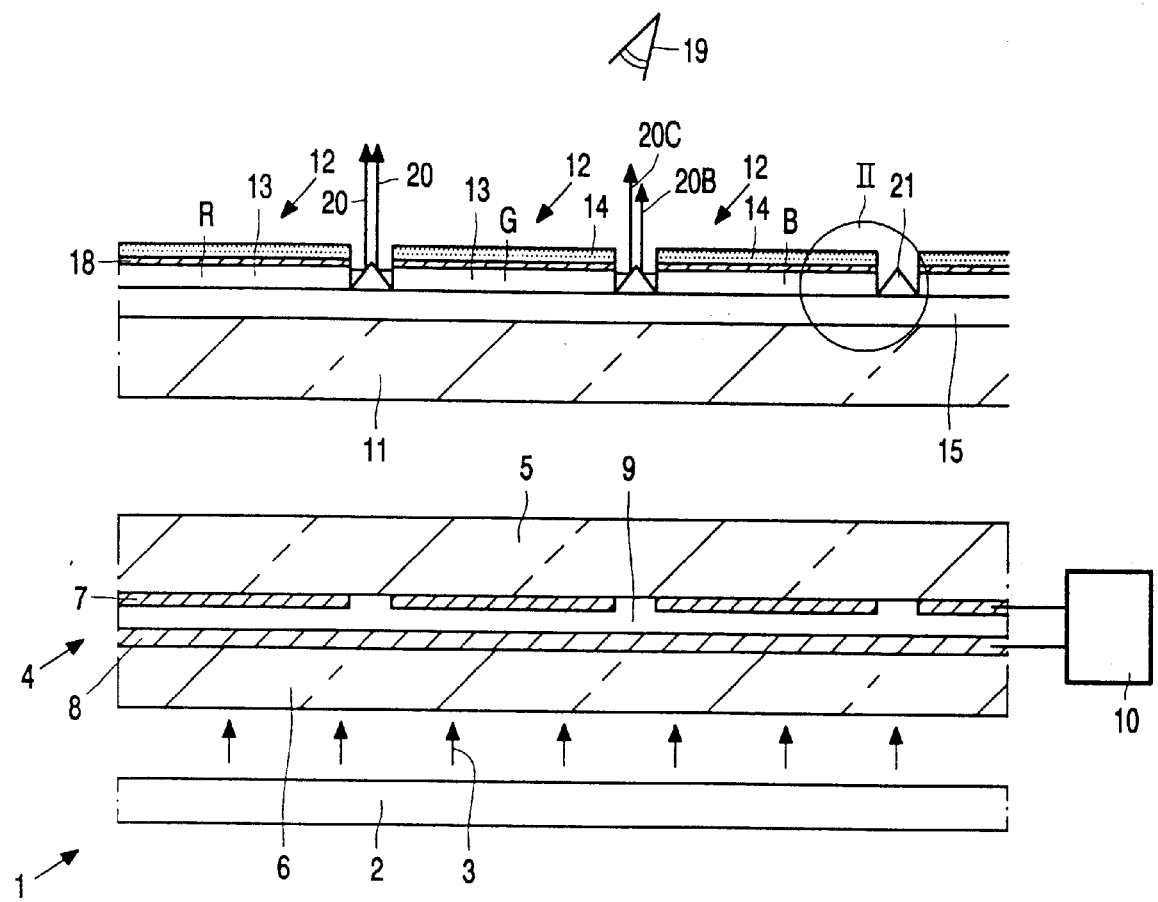
FIG. 1 is a diagrammatic cross-section of a part of a display device according to the invention.

FIG. 1 shows a display device 1 according to the invention with an illumination source 2 (backlight) emitting UV radiation 3. The UV radiation 3 is modulated by means of a switch or modulator 4, in this example, a liquid crystal switch. The liquid crystal switch comprises a liquid crystal material 9, for example, a twisted nematic LC material or a ferroelectric LC material between two substrates 5, 6. The substrates 5, 6 are provided with electrodes 7, 8 which, jointly with the interpositioned LC material define the quantity of transmitted UV radiation at the area of the pixels. To this end, the electrodes are connected (either or not via switching elements) to, for example, row and column connections which are driven by a drive unit 10. Alternatively, the switch 4 may make use of electro-optical effects other than a liquid crystal effect.

The modulated UV radiation reaches patterned areas 12 provided on a substrate 13, which patterned areas correspond to parts of the UV switch defined by the electrodes 7, 8 and thus define a pixel. Although they are separately shown, the substrates 5, 11 may be alternatively realized as one substrate. Each patterned layer (denoted by R, G, B in FIG. 1) comprises a layer 13 of an electroluminescent material having a composition to be described hereinafter. According to the invention, layers 14 of a light-absorbing material, for example, a mixture of pigments in acrylic monomers are present on the layers 13. Preferably, the acrylate binder can be patterned by means of photolithography so that the absorbing layer can be easily removed at the area of the light-reflecting or light-scattering elements 21 to be provided. The layer 13 is now situated between two layers having different refractive indices. The light generated in the layer 13 is mainly reflected on the interface between the layers 13, 14. Likewise, the light is reflected on the interface between the layers 13, 11. Consequently, waveguiding occurs in the layer 13, notably when a suitable luminescent material is chosen for this purpose such as, for example, a photoluminescent material (for example, a material comprising Perylene) or dyes dissolved in an acrylate.

Figure 2:
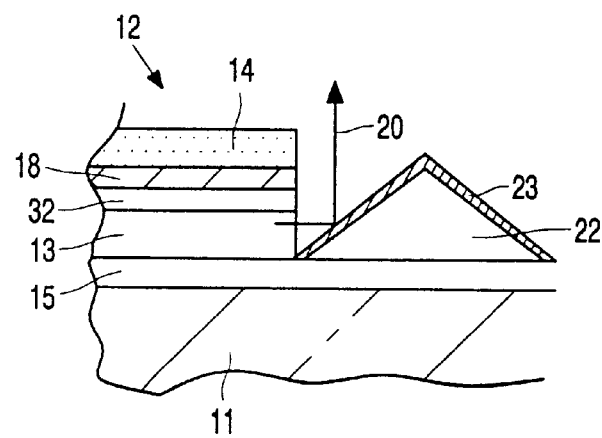
FIG. 2 shows an enlarged part of the area denoted by the circle II in FIG. 1.

The light 20 generated in the layers 13 now exits sideways (FIG. 2) and impinges upon light-reflecting or light-scattering elements 21, in this example, a roof-shaped or semi-circular ridge 22 provided with a reflective layer 23. Exiting light 20 is reflected by this (reflective) layer 23 in the direction of the viewer 19.

The waveguiding effect is even intensified by providing a light-reflecting or reflective layer 18 (reflecting in the direction of the layer 13) between the layer 13 of luminescent material and the absorbing layer 14. This may be a metallic mirror such as aluminum. The effect is further intensified by coating the reflective layer 18 with a layer 32 having a low refractive index, such as $SiO_2$. Absorption on the double layer 18, 32 is minimal. To further intensify the waveguiding effect, a dielectric layer or a stack of dielectric layers (dielectric mirror 15) is preferably provided between the substrate 11 and the layer 13 which is transparent to the exciting (UV) radiation and reflects emitted visible light.

Figure 3:
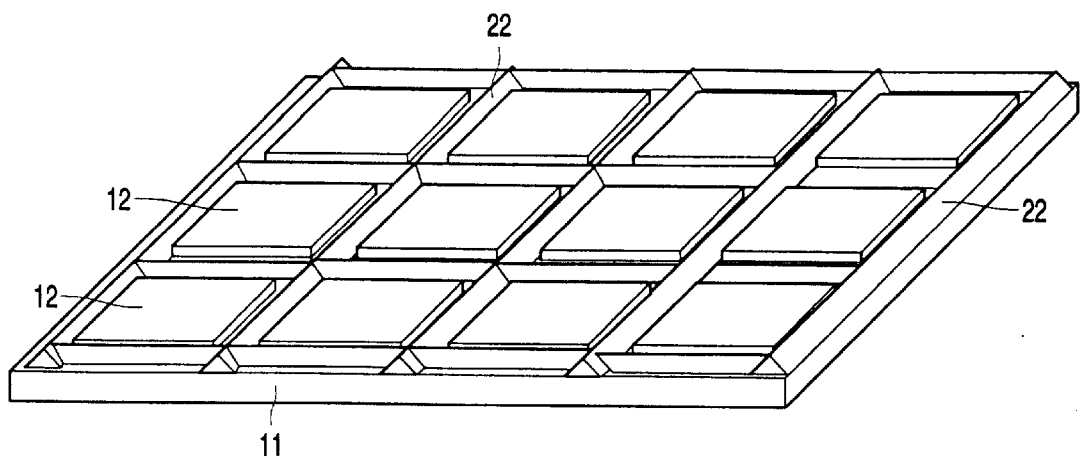
FIG. 3 is a diagrammatic elevational view of a part of the display device of FIG. 1.

FIG. 3 is an elevational view of a number of patterned areas 12 on the substrate 11, each surrounded by the ridges 22.

Figure 4:
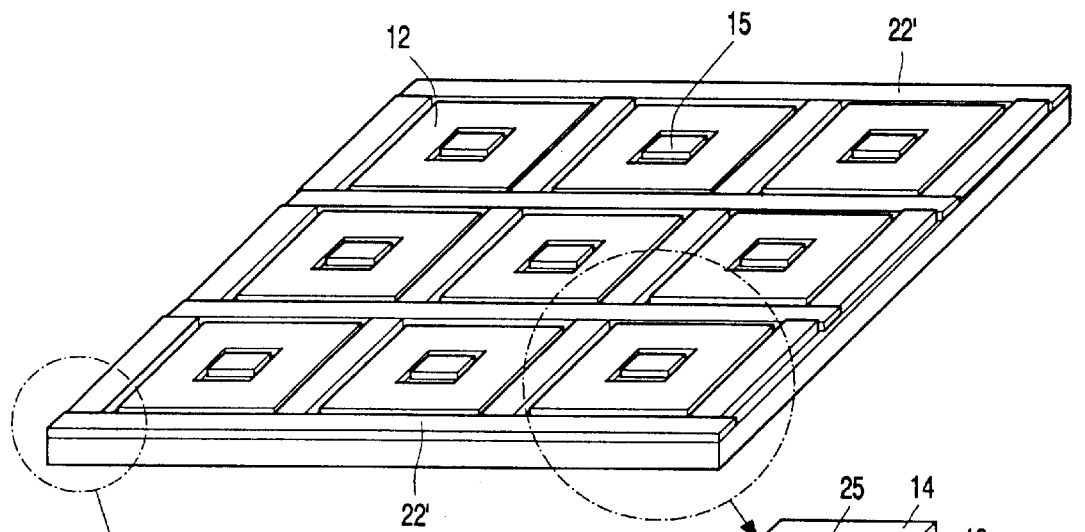
FIG. 4 shows a variant of the display device of FIG. 3, FIGS. 5 to 7 show a display device during different stages of manufacture.
Figure 4A:
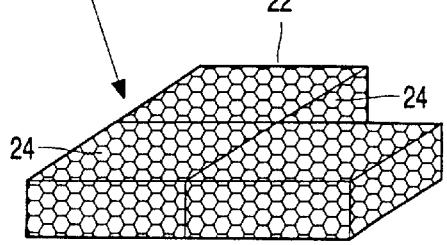
Figure 4B:
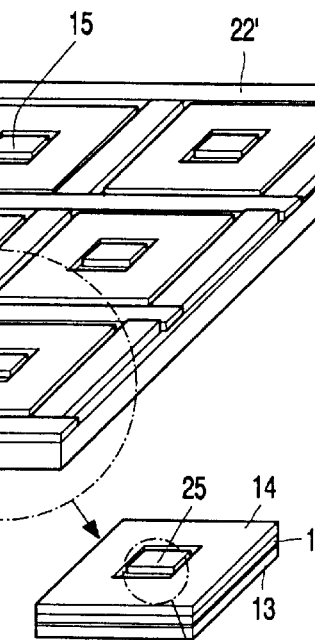
Figure 4C:
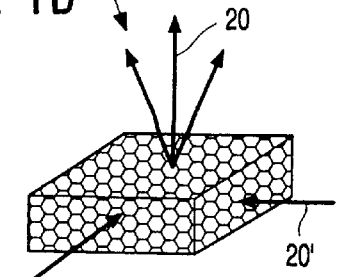

In the device of FIG. 4, the ridges are replaced by strip-shaped tracks 22' of a light-scattering material, in this example made of a transparent acrylic resin and patterned photolithographically, in which scattering particles having a refractive index differing from acrylic resin are provided, in this example, titanium oxide particles 24. The device of FIG. 4 also comprises extra light-scattering areas 25 in the centers of the patterned areas 12. Light 20' generated by the waveguiding effect is now also scattered in the centers of the areas 12 so that a better distribution of light (notably when the pixels have larger dimensions) and a higher light output are achieved.

Figure 5:
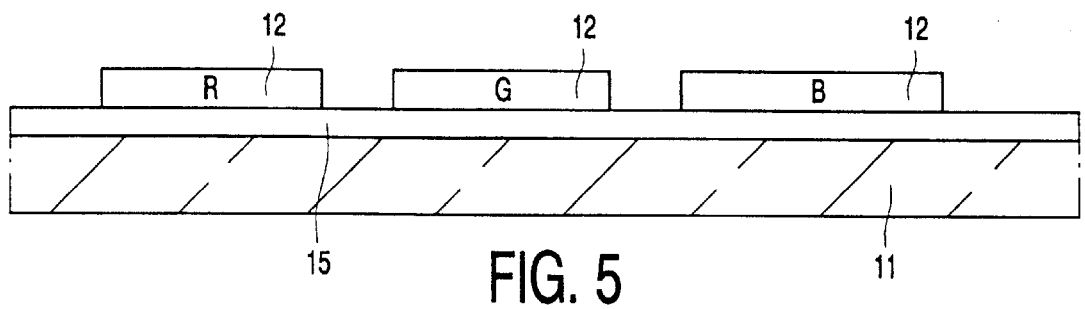

The manufacture of a display device according to the invention starts from a substrate 11 of, for example, glass or a synthetic material, on which a dielectric layer (stack or dielectric mirror) 15 is provided which is transparent to UV radiation and reflects visible light. The patterned areas 12 are obtained by providing them successively for different colors by means of a photolithographical process (for example, masked etching and curing of a negative photoresist, provided with a dye) (see FIG. 5).

Figure 6:
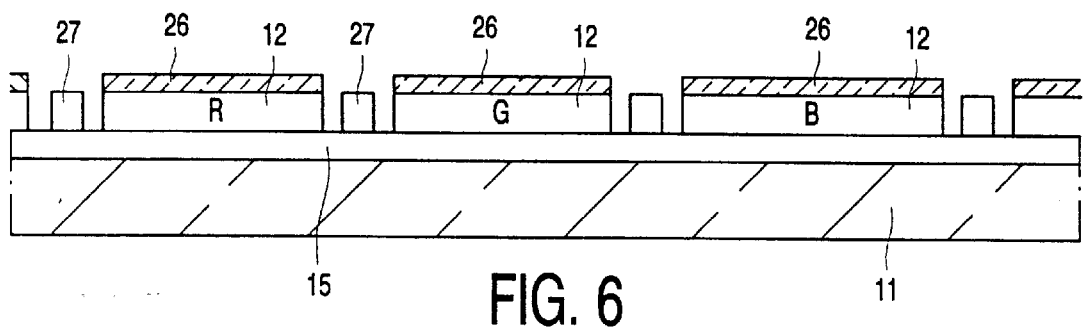
Figure 7:
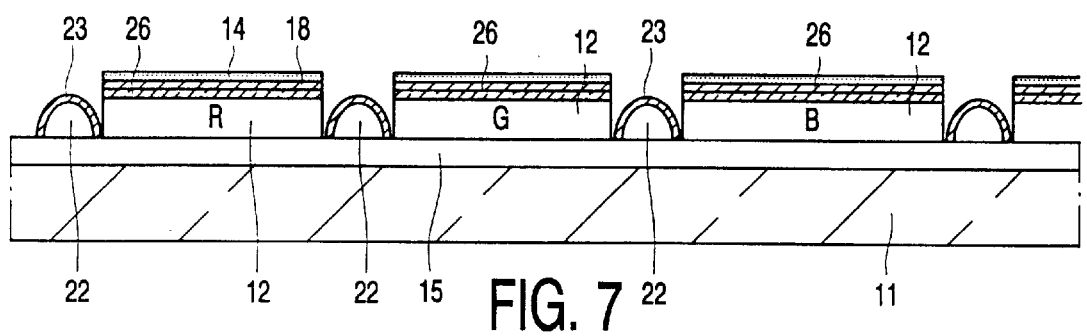

Subsequently, a layer of $SiO_2$ is (vapor) deposited and photolithographically provided (patterned with a positive photoresist) in such a way that the patterned areas 12 are coated with an $SiO_2$ layer 26 (see FIG. 6). Subsequently, strips of a negative photoresist 27 are provided by means of a mask, which strips are cured in such a way that deformation is still possible at a temperature above the softening point. When heating up to a temperature above the softening point, the strip-shaped parts of photoresist are deformed so that substantially semi-cylindrical parts 22 are left ultimately (see FIG. 7). In a subsequent lithographic step, the patterned areas 12 (coated with an $SiO_2$ layer 26) and the semi-cylindrical parts 22 are photolithographically coated with a reflective layer 18, 23, respectively, of aluminum in this example. Finally, layers 14 of a light-absorbing material are provided at the location of the patterned areas 12, for example, by patterning and curing a negative photoresist such as acrylate with red, blue and green dyes dissolved therein. The device of FIG. 7 is then obtained, which forms part of a picture display device as described with reference to FIGS. 1 to 3.

Figure 8:
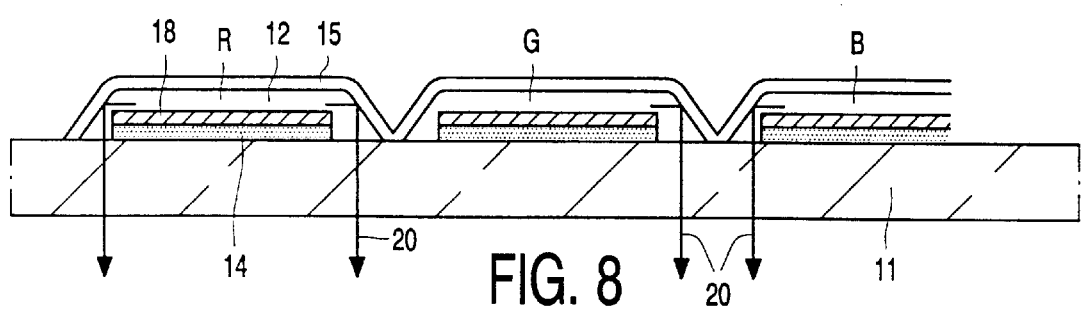
FIG. 8 is a cross-section of another display device according to the invention.
Figure 9:
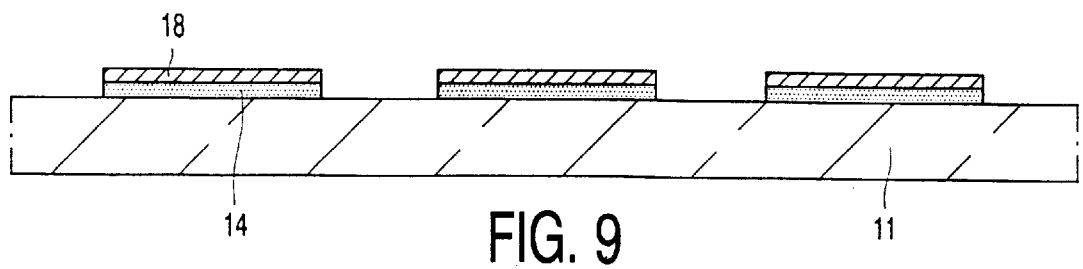

In another method of manufacture, a substrate 14 is coated with a double layer of $CrO_2$ and Cr which is patterned photolithographically. The layers 14 of light-absorbing material ($CrO_2$) are now situated on the substrate 11 and are coated by reflecting layers 18 (chromium layers in this example) (see FIG. 9). In three consecutive steps, red, green and blue patterned areas 12 are then obtained by providing them successively for different colors by means of a photolithographic process (for example, again masked etching and curing of a negative photoresist, provided with a dye). By overexposure of the photoresist during exposure (the amount of light is higher than is necessary to obtain an image of the mask used), slopes (see FIG. 8) are obtained along the edges of the patterned areas 12. The assembly is now coated with a dielectric layer 15 which is transparent to UV radiation and reflects visible light. The device of FIG. 9 is then obtained, which forms part of a picture display device as described with reference to FIGS. 1 to 3, on the understanding that the photoluminescent areas 12 are now situated on the side of the substrate facing the modulator 4, and the light 20 exits through this substrate.

The device of FIG. 4 may also generate light itself, for example, when the areas 12 are built up as a polymer LED which may comprise a plurality of sub-layers. In the example of FIG. 8, the layers 18 then also function as electric contact layers and extend transversely to the plane of the drawing. For the other contact between the dielectric layer 15 and the patterned areas 12, transparent indium oxide or indium tin oxide (ITO) layers may be provided which extend in the plane of the drawing (x, y matrix). The ITO layers have a high work function and function as positive electrodes (for injection of holes in the active area 12). A good negative electrode (for injection of electrons in the active area 12) is obtained by choosing aluminum for the reflecting layer 18.

Figure 14:
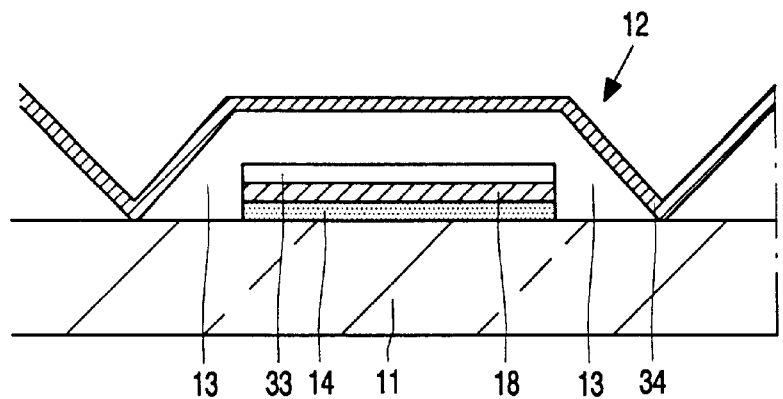
FIGS. 14 and 15 show other embodiments of parts of a display device according to the invention.

In a variant (FIG. 14) contacting takes place by coating the reflecting layer 18 of, for example, chromium with the material having a high work function, for example an ITO layer 33. The LED within the patterned area 11 now has a reflecting contact layer 34 of, for example, aluminum. A plurality of patterned areas 11 forms a matrix, the individual elements of which are selected because patterned layers 18, 31 extend perpendicularly to the plane of the drawing, while patterned contact layers 34 extend parallel to the substrate 11. Otherwise, the reference numerals have the same designation as in the previous examples.

Figure 15:
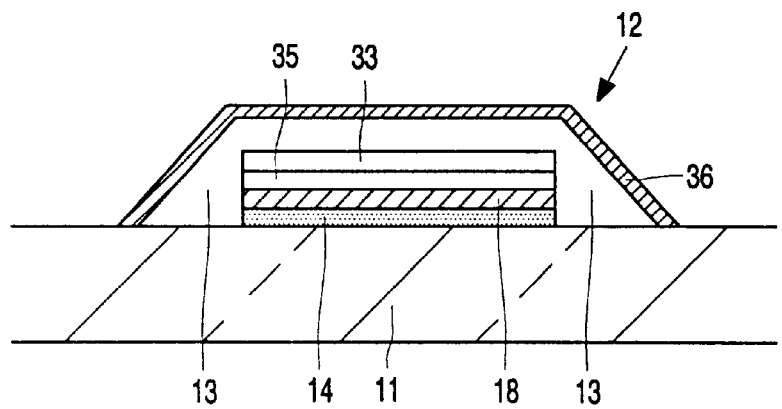

In the variant of FIG. 15, a LED is formed by providing a layer of electroluminescent material 35 between an ITO electrode 33 and an aluminum electrode 18, which electroluminescent material emits blue light and is, for example, polyphenylene vinylene (PPV) (possibly in combination with a polythiophene layer).

The luminescent material 13 is now excited by the emitted blue light. The material 13 of the area 12 is chosen to be such that it emits, for example, green or red light upon excitation by blue light. The patterned area 12 is also again (partly) coated with a reflecting layer 36.

Figure 10:
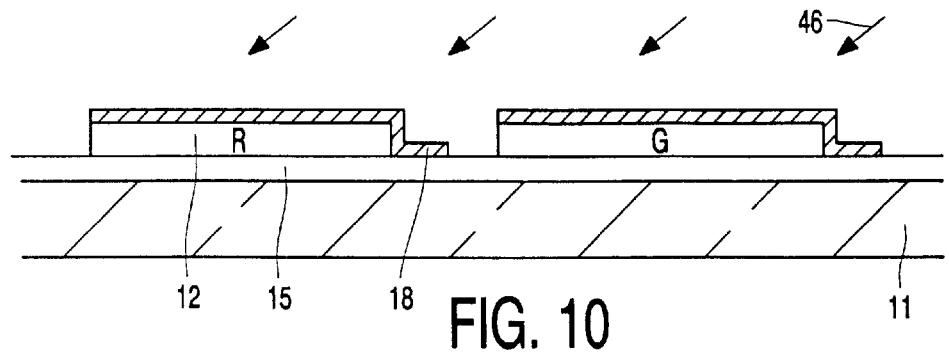
FIGS. 10 to 13 show other display devices during several stages of manufacture.
Figure 11:
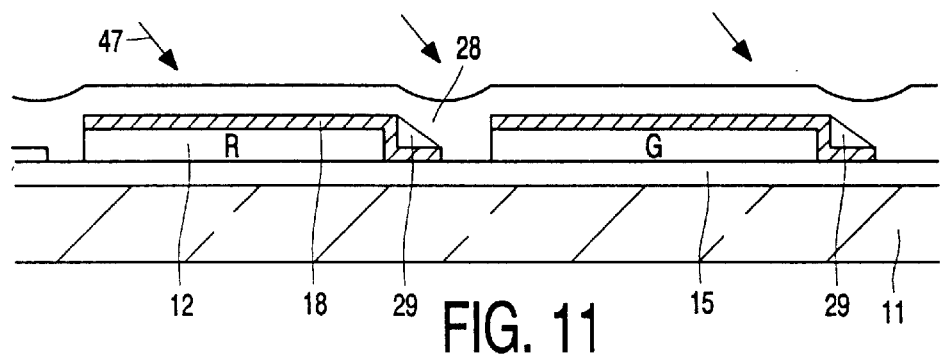
Figure 12:
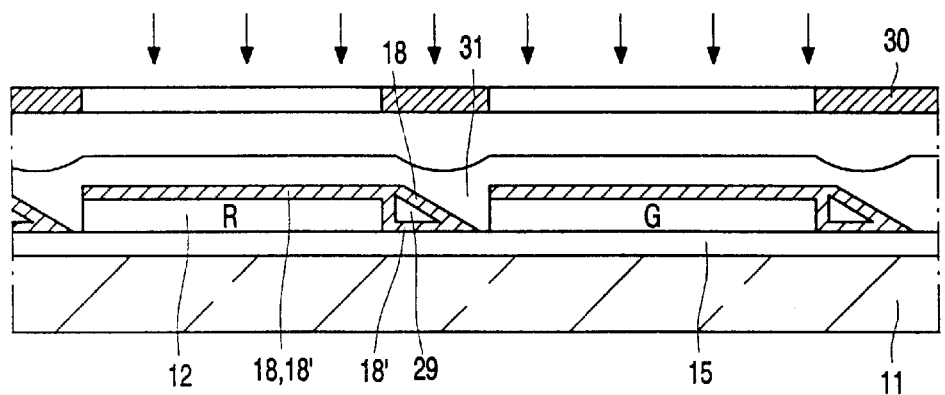
Figure 13:
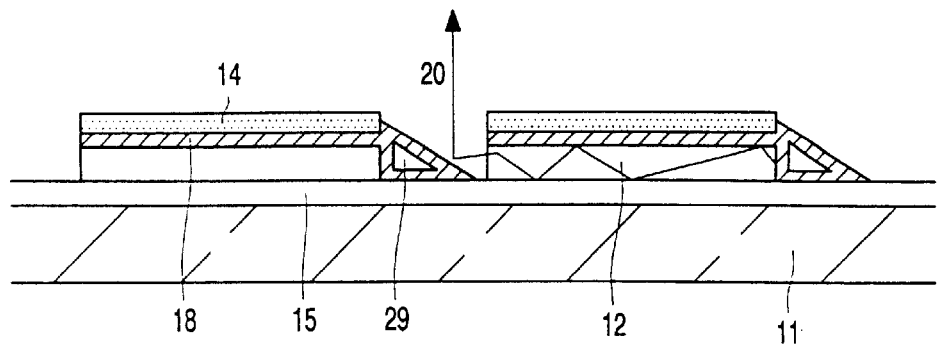

In yet another manufacturing method, and after the patterned areas 12 (comparable with FIG. 5) have been provided, the light-reflecting material, aluminum in this example, is (vapor) deposited in a first direction 46 (for example, along the diagonal direction of the individual areas) at an angle of between 10 and 30 degrees with respect to the normal on the surface. This produces a shadow effect during vapor deposition so that the areas 12 are coated on only one side (or two sides upon diagonal exposure) with a reflecting layer 18 (see FIG. 10) which also partly covers the dielectric layer 15 between the patterned areas 12. The assembly is subsequently coated with a layer of positive photoresist material 28 which is subsequently exposed from the opposite direction 47 at an angle which is dependent on the resist used but is larger than 45 degrees with respect to the normal on the surface. After development, the unexposed parts 29 (see FIG. 11) are left. In a second (vapor) deposition step in the first direction 46 at an angle of between 10 and 30 degrees with respect to the normal on the surface, the ultimate reflecting layer 18 (see FIG. 12) is provided on the upper surface of the patterned areas 12 and on the oblique sides of the unexposed parts 29. The assembly is then coated with a black negative photoresist 31 (for example, again an acrylate with red, blue and green pigments dissolved therein) and exposed via the mask 30. After development, the structure of FIG. 13 is obtained. In this structure, light 20 which is generated in the patterned electroluminescent area, leaves this area on one or two sides and is reflected on the other side(s).

Figure 16:
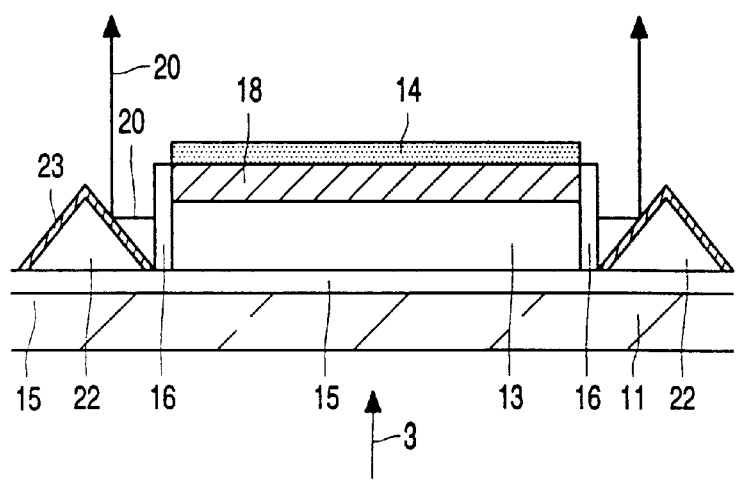
FIG. 16 shows another variant.

Besides luminescence generated by UV radiation or by current passage (poly LED) light may be alternatively generated in a completely different way. This is illustrated with reference to FIG. 16 showing a part of the display device, comparable with one of the patterned areas 13 in FIG. 1. One or more head ends of the areas 13 are now provided with semi-transparent mirrors 16. The material of the areas 13 is chosen to be such that the (modulated) UV radiation causes inversion due to optical pumping. Optical oscillation is thus obtained in the optical resonator formed by an area 13. Coherent light beams 20 exit through the semi-transparent mirrors 16 and are reflected on the reflecting mirrors 23 again in the direction of the viewer.

It will be evident that the invention is not limited to the embodiments shown, but that many variations are possible within the scope of the invention. For example, the layer 13 may be implemented as a poly LED also in the device of FIG. 1. Instead of an LCD device, other (UV) switches may be chosen for the UV switch, such as plasma-addressed LCDs, mechanical switches and electrostatic switches. For UV generation, use may also be made of plasma displays. There is also a great variation of the choice of materials to be used.

In summary, the invention relates to a display device in which light is generated in patterned areas by means of electroluminescence (via UV radiation, LED driving or optical pumping), which light leaves the areas through a raised edge as a result of waveguiding and is scattered or reflected in the direction of the viewer.

The invention resides in each and every novel characteristic feature and each and every combination of characteristic features.

What is claimed is:

1. A display device comprising a first substrate with pixels, provided with a patterned layer of luminescent material, and means for exciting the luminescent material during use, characterized in that at least an area of the layer of luminescent material is situated between a layer absorbing light at the viewer's side of the display device and a dielectric layer, and the patterned layer of luminescent material is provided with light-reflecting or light-scattering means at least along a part of its edge, wherein a portion of light exiting directly from the edge is reflected in the direction of a viewer.

2. A display device as claimed in claim 1, characterized in that a layer reflecting light in the direction of the layer of luminescent material is situated between the light-absorbing layer and the layer of luminescent material.

3. A display device as claimed in claim 1, characterized in that the dielectric layer comprises a layer reflecting light in the direction of the layer of luminescent material.

4. A display device as claimed in claim 1, characterized in that the area of the layer of luminescent material has at least one aperture which is provided with light-reflecting or light-scattering means.

5. A display device as claimed in claim 1, characterized in that the light-reflecting means have reflective surfaces at an angle of approximately 45° with respect to the substrate.

6. A display device as claimed in claim 1, characterized in that at least one head end of an area of the layer of luminescent material is provided with semi-transparent mirrors.

7. A display device as claimed in claim 1, characterized in that the means for exciting the luminescent material during use comprise a source for UV-radiation and a light modulator chosen from the group of LCD switches, mechanical switches, electromechanical switches, electrostatic switches and plasma display devices.

8. A display device as claimed in claim 1, characterized in that the means for exciting the luminescent material during use comprise a light-emitting diode.

9. A display device as claimed in claim 1, characterized in that the luminescent material comprises at least one light-emitting diode.

10. A method of manufacturing a display device as claimed in claim 1, characterized in that a patterned layer of luminescent material is provided on a substrate, whereafter a layer of light-reflecting material is deposited in a first direction at an angle of between 10 and 30 degrees with respect to the normal on the surface, reflecting or light-scattering material is provided interspersed within the patterned luminescent material and is coated with a light-absorbing material.

11. A method as claimed in claim 10, characterized in that, after deposition of the layer of reflecting material, the surface is coated with a layer of positive photoresist which is exposed at an angle of more than 45 degrees with respect to the normal from a second direction opposite to the first direction, and the oblique edges of cured photoresist obtained after development are coated with a layer of a reflecting or light-scattering material.

12. A method of manufacturing a display device as claimed in claim 1, characterized in that a patterned layer of luminescent material is provided on a substrate, whereafter a pattern of incompletely cured photoresist is provided at the area of the light-scattering or light-reflecting means to be provided, whereafter the photoresist pattern is heated to a temperature above the softening point, whereafter the photoresist pattern thus obtained is coated with a layer of light-scattering or light-reflecting material.

* * * * *